(12) United States Patent  
Xu et al.

(10) Patent No.: US 12,154,715 B2  
(45) Date of Patent: Nov. 26, 2024

(54) METHODS TO SELECTIVELY EMBED MAGNETIC MATERIALS IN SUBSTRATE AND CORRESPONDING STRUCTURES

(71) Applicant: Intel Corporation, Santa Clara, CA (US)

(72) Inventors: Cheng Xu, Chandler, AZ (US); Kyu-Oh Lee, Chandler, AZ (US); Junnan Zhao, Gilbert, AZ (US); Rahul Jain, Gilbert, AZ (US); Ji Yong Park, Chandler, AZ (US); Sai Vadlamani, Chandler, AZ (US); Seo Young Kim, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 210 days.

(21) Appl. No.: 17/873,518

(22) Filed: Jul. 26, 2022

(65) Prior Publication Data

US 2022/0367104 A1    Nov. 17, 2022

Related U.S. Application Data

(62) Division of application No. 15/938,119, filed on Mar. 28, 2018.

(51) Int. Cl.
*H01F 27/28* (2006.01)
*H01F 27/02* (2006.01)
(Continued)

(52) U.S. Cl.
CPC ....... *H01F 27/2804* (2013.01); *H01F 27/022* (2013.01); *H01F 27/24* (2013.01); *H05K 1/185* (2013.01); *H05K 2201/10* (2013.01)

(58) Field of Classification Search
CPC .... H01F 27/2804; H01F 27/022; H01F 27/24; H05K 1/185; H05K 2201/10
(Continued)

(56) References Cited

U.S. PATENT DOCUMENTS 8,664,745 B2    3/2014  Teggatz  
2009/0160595 A1  6/2009  Feng  
(Continued)

FOREIGN PATENT DOCUMENTS

CN    207425543 U    5/2018  
JP    2006196731       7/2006

OTHER PUBLICATIONS

Office Action from Korean Patent Application No. 10-2019-0022879, mailed Mar. 12, 2024, 13 pgs.
(Continued)

*Primary Examiner* — Andargie M Aychillhum  
(74) *Attorney, Agent, or Firm* — Schwabe, Williamson & Wyatt P.C.

(57) ABSTRACT

Embodiments include an inductor that comprises an inductor trace and a magnetic body surrounding the inductor trace. In an embodiment, the magnetic body comprises a first step surface and a second step surface. Additional embodiments include an inductor that includes a barrier layer. In an embodiment, an inductor trace is formed over a first surface of the barrier layer. Embodiments include a first magnetic body over the inductor trace and the first surface of the barrier layer, and a second magnetic body over a second surface of the barrier layer opposite the first surface. In an embodiment, a width of the second magnetic body is greater than a width of the first magnetic body.

25 Claims, 11 Drawing Sheets

(51) Int. Cl.
*H01F 27/24* (2006.01)
*H05K 1/18* (2006.01)

(58) Field of Classification Search
USPC .......................................................... 361/761
See application file for complete search history.

(56) References Cited

U.S. PATENT DOCUMENTS

2015/0124418 A1* 5/2015 Song ...................... H05K 1/165
   361/765
2018/0286687 A1* 10/2018 Oster ...................... H05K 1/165

OTHER PUBLICATIONS

Notice of Allowance from Korean Patent Application No. 10-2019-0022879, mailed May 17, 2024, 4 pgs.

* cited by examiner

METHODS TO SELECTIVELY EMBED MAGNETIC MATERIALS IN SUBSTRATE AND CORRESPONDING STRUCTURES

CROSS-REFERENCE TO RELATED APPLICATIONS

This application is a division of U.S. patent application Ser. No. 15/938,119, filed on Mar. 28, 2018, the entire contents of which is hereby incorporated by reference herein.

TECHNICAL FIELD

Embodiments of the present disclosure relate to electronics packaging, and more particularly, to electronics packaging with embedded magnetic material to form passive devices.

BACKGROUND

Improvement in power delivery is needed in packaging architectures in order to meet increasingly demanding electrical requirements. Furthermore, the improvement in power delivery needs to be implemented without increasing the form factor (e.g., the Z-height) of packages. One way to obtain the desired improvements in power delivery is by utilizing magnetic materials on coreless substrates.

However, substrate manufacturing process used today for integrating magnetic material into the package lead to interactions with wet chemistries such as desmear, electroless plating, flash etch, soft etch, surface finishes, and the like. In particular, processing environments interact negatively with the magnetic fillers (e.g., Fe fillers). For example, the processing environment may interact with the magnetic materials and result in corrosion. Additionally, the magnetic fillers may leach into the chemistry bath and reduce the bath life and chemistry performance.

EMBODIMENTS OF THE PRESENT DISCLOSURE

Described herein are electronic packages with magnetic materials and methods of forming such packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the inclusion of magnetic materials in the manufacture of organic packages is currently problematic due to the leaching of magnetic materials (e.g., iron, alloys containing iron, and other ferromagnetic particles or elements) into processing baths and corrosion. Accordingly, it is presently not feasible to integrate components, such as inductors, that benefit from the use of magnetic materials into organic substrates.

However, embodiments described herein provide processing methods that allow for the integration of magnetic materials into organic packages. Particularly, embodiments include embedding magnetic materials so that the magnetic materials are not exposed to processing environments where the leaching of magnetic materials is detrimental. For example, embodiments include embedding the magnetic materials so that the magnetic materials are not exposed to processing environments that have chemistries that may be negatively altered by leached magnetic materials, such as electroless baths, desmear baths, subtractive etching baths and the like. Since the magnetic material is isolated from such environments, there is no need to redesign the chemistries of processing baths or provide dedicated processing baths to handle the magnetic materials.

Figure 1:
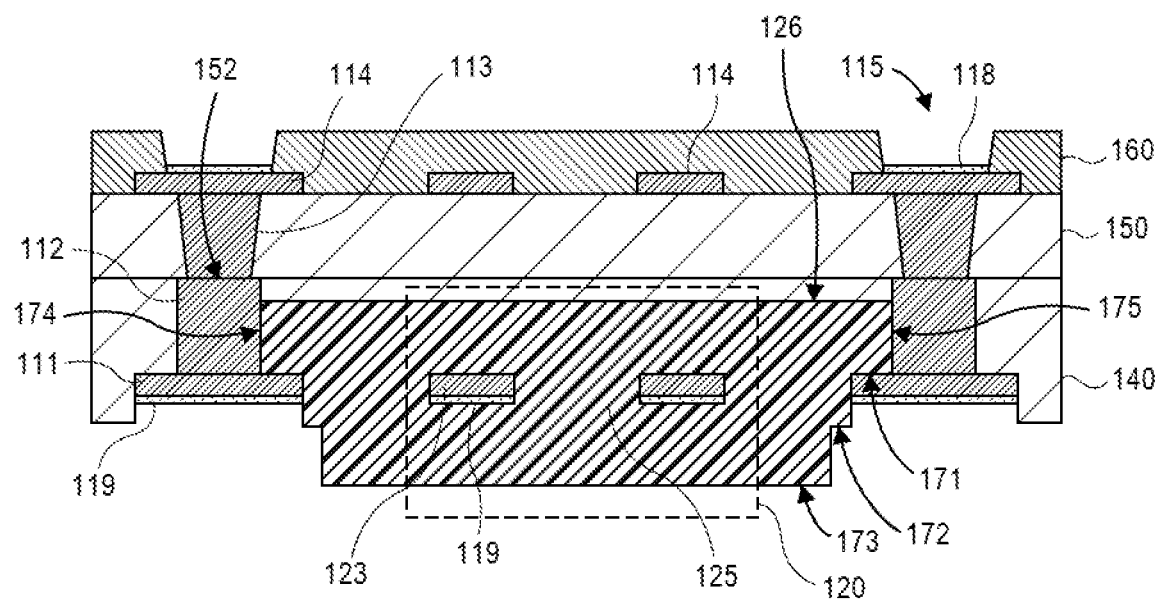
FIG. 1 is a cross-sectional illustration of a package with an inductor trace that is surrounded by a magnetic body, in accordance with an embodiment.

Referring now to FIG. 1, a cross-sectional illustration of an electronic package 100 with an inductor 120 surrounded by a magnetic body 125 is shown, in accordance with an embodiment. In the illustrated embodiment, the electronic package 100 may include one or more dielectric layers 140 and 150. In an embodiment, the first dielectric layer 140 and the second dielectric layer 150 may be any suitable organic dielectric material, such as build-up film. In an embodiment, the dielectric layers 140 and 150 may be part of a coreless electronic package 100, or the dielectric layers 140 and 150 may be part of an electronic package 100 with a core.

In an embodiment, a passive device 120 may be integrated into the one or more dielectric layers 140 and 150. In an embodiment, the passive device 120, such as an inductor, is integrated into the first dielectric layer 140. In the illustrated embodiment, the passive device 120 may include inductor traces 123 that are surrounded by a magnetic body. In an embodiment, the inductor traces 123 may have barrier layers 119 over one or more surfaces. For example, the barrier layers 119 may include metal barrier layers (e.g., NiPdAu) and/or organic surface protection (OSP) materials. The inductor traces 123 may be formed with the same processing operations used to form a first conductive layer 111 in the first dielectric layer 140. Accordingly, a thickness of the inductor traces 123 and a thickness of the first conductive layer 111 may be substantially the same. Furthermore, a surface of the inductor traces 123 may be substantially coplanar with a bottom surface of conductive pillars 112 formed over the first conductive layer 111. As used herein, substantially coplanar surfaces are surfaces that are within +/−5 microns. In an embodiment, the inductor 120 may include a transmission line inductor, a spiral inductor, or a solenoid inductor.

In an embodiment, the magnetic body 125 may have a geometry that is defined, at least partially, by the first conductive layer 111 and the pillars 112. In an embodiment, the magnetic body 125 may be formed between neighboring pillars 112. The magnetic body 125 may have sidewalls 175 and 174 that contact surfaces of the pillars 112. Accordingly, the sidewalls 175 and 174 may have a profile that is the same profile as the pillars 112. For example, the sidewalls 175 and 174 may be substantially vertical. As used herein, substantially vertical sidewalls are sidewalls that are within +/−5° of orthogonal to an underlying layer. It is to be appreciated that the pillars 112 may also include any feature that can confine the magnetic body 125. For example, the pillars 112 may also refer to a wall, a block, a circular pad, or the like.

In an embodiment, the magnetic body 125 may also conform to the first conductive layer 111. The magnetic body may include a first step surface 171 that is formed over the first conductive layer 111. As such, the first step surface 171 may be substantially coplanar to a surface of the inductor traces 123. In an embodiment, the magnetic body 125 may also include a second step surface 172. The second step surface 172 may be located between the first step surface 171 and a second major surface 173. In an embodiment, the second step surface 172 may be substantially coplanar with a surface of the first dielectric layer 140. In an embodiment, a first major surface 126 may be below a top surface 152 of the pillars 112. In an embodiment, a portion of the first dielectric layer 140 may be formed in direct contact with the first major surface 126 of the magnetic body.

In an embodiment, the electronic package 100 may include conductive vias and traces 113, 114 formed in and/or over the second dielectric layer 150. In an embodiment, a solder resist layer 160 may be formed over the second dielectric layer 150. In an embodiment, openings 115 may be made into the solder resist layer 160 to expose portions of the conductive traces 114. In an embodiment, the exposed portions 114 may include a surface protection layer 118.

Figure 2:
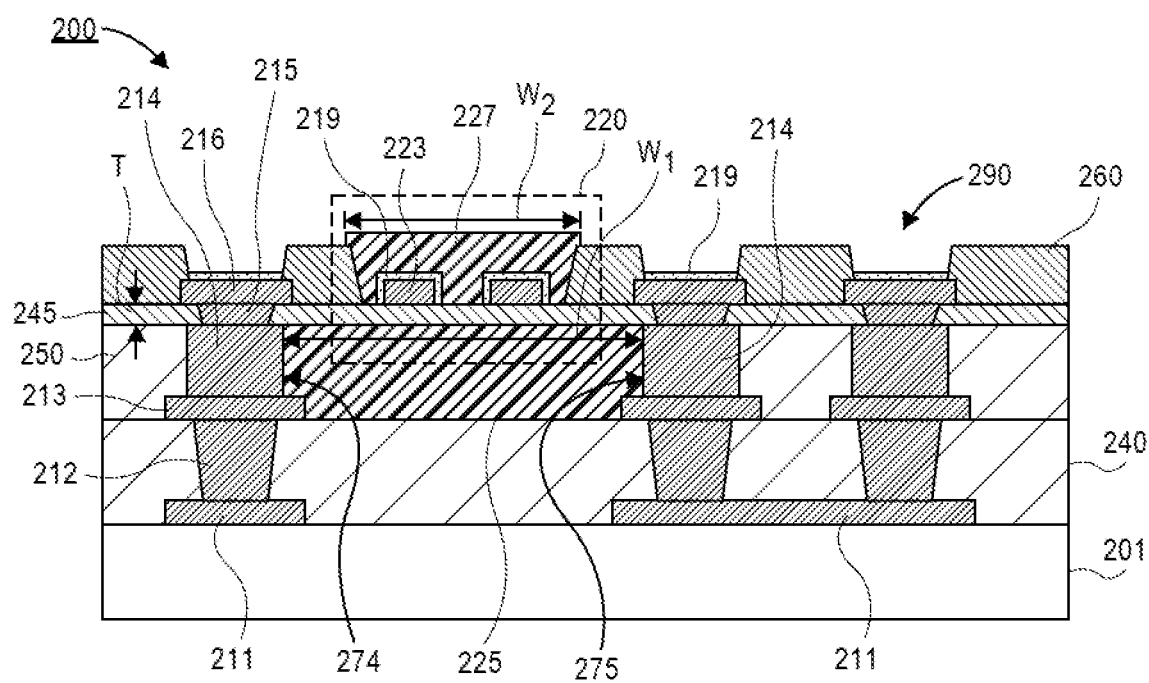
FIG. 2 is a cross-sectional illustration of a package with an inductor trace that is surrounded by a first magnetic body and a second magnetic body, in accordance with an embodiment.

Referring now to FIG. 2, a cross-sectional illustration of an electronic package 200 that includes a passive device 220 surrounded by a first magnetic body 225 and a second magnetic 227 is shown, in accordance with an embodiment. In an embodiment, the electronic package 200 may include a core 201 or the electronic package 200 may be coreless. In an embodiment, the electronic package may include a first dielectric layer 240 and a second dielectric layer 250. In an embodiment, conductive traces 211 and vias 212 may be formed in and through the first dielectric layer. In an embodiment, the passive device 220 may include an inductor. In an embodiment, the inductor 220 may include a transmission line inductor, a spiral inductor, or a solenoid inductor.

In an embodiment, the passive device may include a first magnetic body 225 formed in the second dielectric layer 250. In an embodiment, the first magnetic body 225 may be formed between pillars 214 that are formed over conductive traces 213. In an embodiment, the first magnetic body 225 may have a thickness that is substantially equal to the thickness of the second dielectric layer 250. In an embodiment, the first magnetic body 225 may have substantially vertical sidewalls 274 and 275 that contact the pillars 214. It is to be appreciated that the pillars 214 may also include any feature that can confine the first magnetic body 225. For example, the pillars 214 may also refer to a wall, a block, a circular pad, or the like.

In an embodiment, a barrier layer 245 may be disposed over a surface of the first magnetic body and the second dielectric layer 250. The barrier layer 245 may be a material that isolates the first magnetic body 225 from wet processing chemistries. In an embodiment, the barrier layer 245 is a dielectric material. In order to provide improved Q values to the inductor 220, a thickness T of the barrier layer 245 may be minimized. In an embodiment, the thickness T of the barrier layer 245 may be less than 10 μm. In an embodiment, the thickness T of the barrier layer 245 may be less than 5 μm.

In an embodiment, inductor traces 223 may be formed directly over the barrier layer 245. In an embodiment, the inductor traces 223 may be formed at the same time as conductive layer 216. As such, the conductive layer 216 may have a thickness that is substantially the same as a thickness of the inductor traces 223. In an embodiment, a surface protection layer 219 may be formed over the inductor traces 223 and the conductive layer 216. For example, the surface protection layer 219 may include metal barrier layers (e.g., NiPdAu) and/or OSP materials.

In an embodiment, a solder resist layer 260 may be formed over the barrier layer 245. Solder resist openings 290 may be formed through the solder resist layer 260. In an embodiment, one of the solder resist openings 290 may be formed over the inductor traces 223. A second magnetic body 227 may be disposed in the opening and surround the surfaces inductor traces 223. As such, the second magnetic body 227 that may include sidewalls that conform to the shape of the solder resist opening 290. For example, sidewalls of the second magnetic body 227 may be tapered. In an embodiment, the second magnetic body 227 may have a width $W_2$ that is less than a width $W_1$ of the first magnetic body. In an embodiment, the second magnetic body 227 may have a thickness greater than a thickness of the solder resist layer 260. In some embodiments, a portion of the second magnetic body 227 may be formed over a top surface of the solder resist layer 260.

Figure 3A:
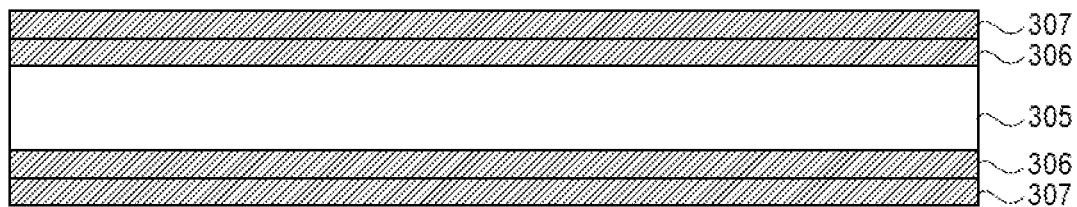
FIG. 3A is a cross-sectional illustration of a dummy core, in accordance with an embodiment.

Referring now to FIGS. 3A-3I, a series of cross-sectional illustrations depicting a process for forming an electronic package with a passive device surrounded by a magnetic body is shown, in accordance with an embodiment. Referring now to FIG. 3A, a cross-sectional illustration of a dummy core 305 is shown, in accordance with an embodiment. In an embodiment, the dummy core 305 may include one or more films 306 and 307 formed over the surfaces. For example, the films may be conductive material, such as copper.

Figure 3B:
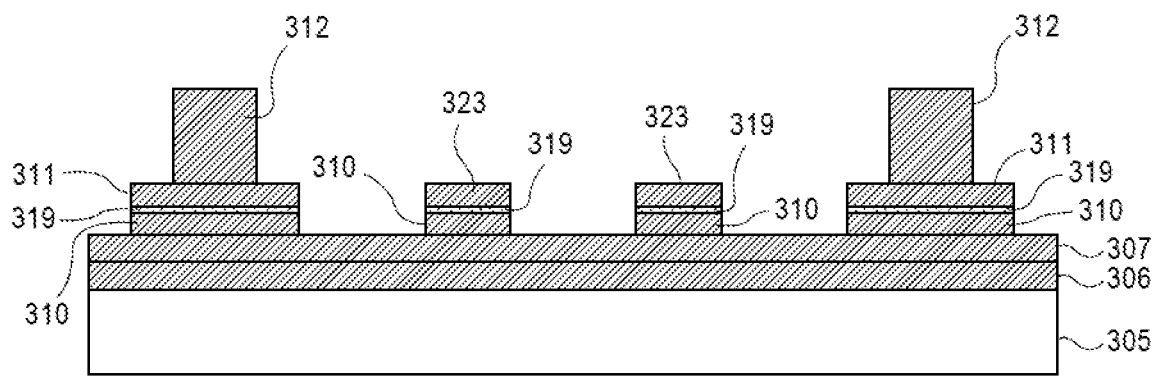
FIG. 3B is a cross-sectional illustration after inductor traces and pillars are disposed over the dummy core, in accordance with an embodiment.

Referring now to FIG. 3B, a cross-sectional illustration after conductive layers are formed is shown, in accordance with an embodiment. In FIGS. 3B-3I only a single side of the dummy core 305 is illustrated. However, it is to be appreciated that similar structures may be formed on both sides of the dummy core 305. In an embodiment, a sacrificial layer 310 may be formed on the film 307. A barrier layer 319 may be formed over the sacrificial layer 310. For example, the barrier layer 319 may be a material that serves as an etch stop layer in a subsequent operation used to remove the sacrificial layer 310. For example, the sacrificial layer 310 may be copper and the barrier layer 319 may be nickel. In an embodiment, the barrier layer 319 may also include metal barrier layers (e.g., NiPdAu) and/or OSP materials.

In an embodiment, a first conductive layer 311 may be formed over the barrier layer 319. At the same time the first conductive layer 311 is formed, inductor traces 323 may be formed over the barrier layer 319. Since the first conductive layer 311 and the inductor traces 323 are formed with the same process, they may have substantially the same thickness. In an embodiment, pillars 312 may then be formed over the first conductive layer 311. According to an embodiment, the pillars may be lithographically defined pillars. As such, sidewalls of the pillars 312 may be substantially vertical. It is to be appreciated that the pillars 312 may also include any feature that can confine the subsequently deposited magnetic body. For example, the pillars 312 may also refer to a wall, a block, a circular pad, or the like.

Figure 3C:
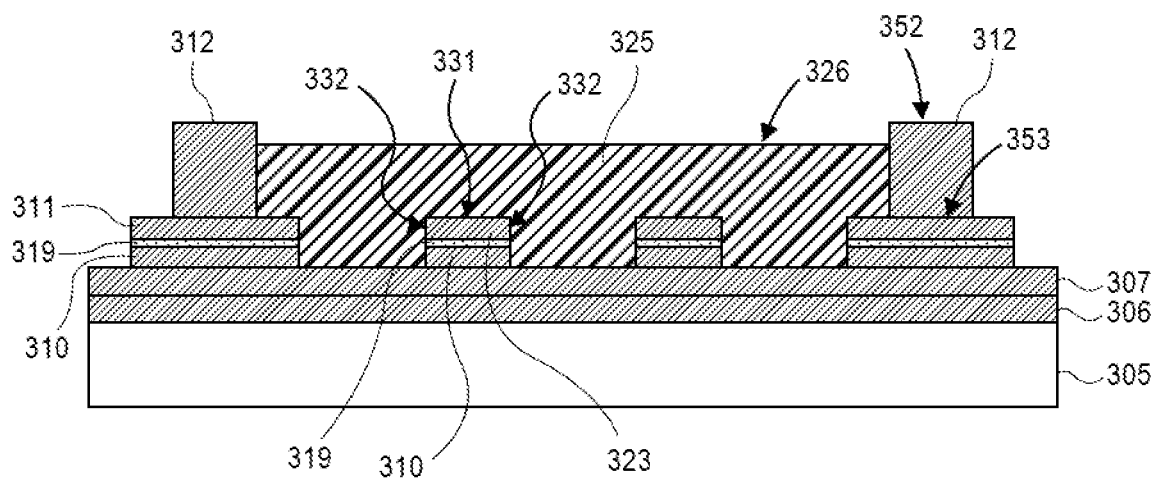
FIG. 3C is a cross-sectional illustration after a magnetic body is disposed between the pillars and over the inductor traces, in accordance with an embodiment.

Referring now to FIG. 3C, a cross-sectional illustration after the magnetic body 325 is disposed over the inductor traces 323 is shown, in accordance with an embodiment. In an embodiment, the magnetic body 325 may be disposed over the inductor traces 323 with a printing process. The presence of the pillars 312 allows for printed magnetic body 325 to be confined. As such, the accuracy of the printing is not critical.

In an embodiment, the magnetic body 325 may surround surfaces of the inductor traces 323. For example, the magnetic body 325 may be in direct contact with a first surface 331, and sidewall surfaces 332 of the inductor traces. In an embodiment, the first surface 331 of the inductor trace may be substantially coplanar with a first pillar surface 353. In an embodiment, a first major surface 326 of the magnetic body 325 may be below a second surface 352 of the pillars 312.

Figure 3D:
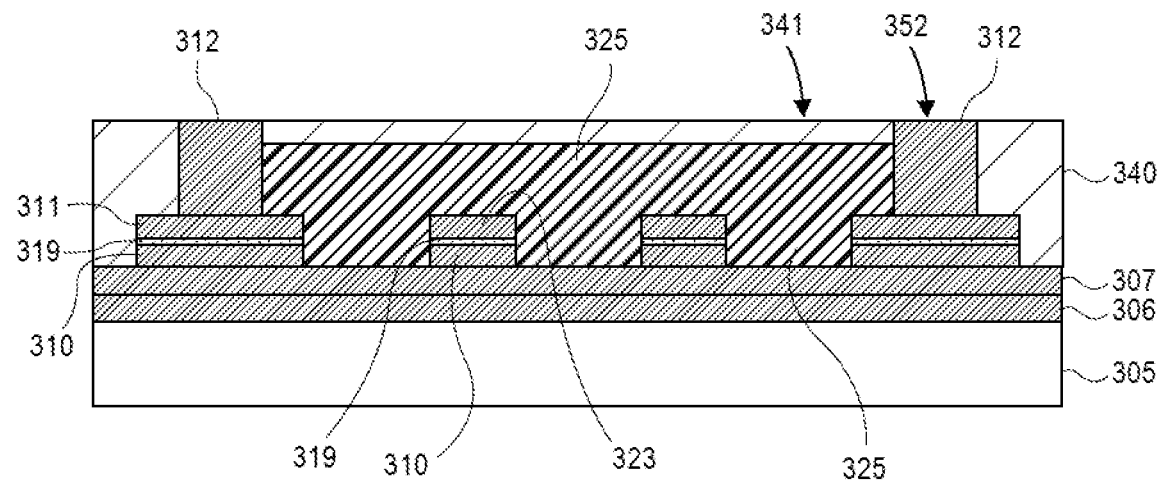
FIG. 3D is a cross-sectional illustration after a first dielectric layer is disposed over the magnetic body, in accordance with an embodiment.

Referring now to FIG. 3D, a cross-sectional illustration after a first dielectric layer 340 is disposed over the magnetic body is shown, in accordance with an embodiment. In an embodiment, the first dielectric layer 340 may be laminated and planarized with the pillars 312. Accordingly, a top surface 341 of the first dielectric layer 340 may be substantially coplanar with the second surface 352 of the pillars 312.

Figure 3E:
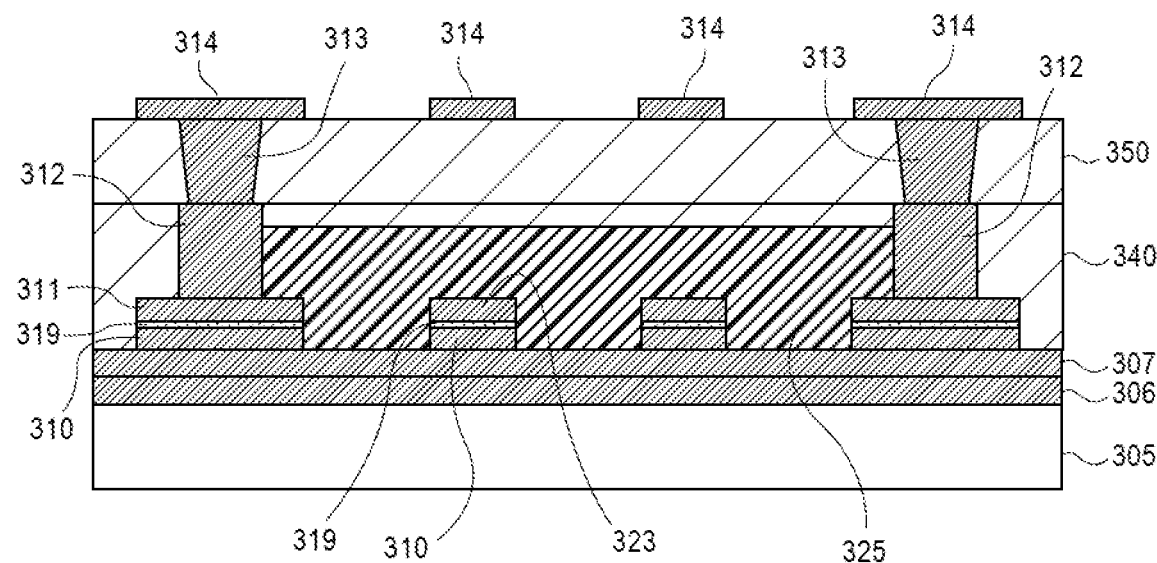
FIG. 3E is a cross-sectional illustration after a second dielectric layer is disposed over the first dielectric layer, in accordance with an embodiment.

Referring now to FIG. 3E, a cross-sectional illustration after a second dielectric layer 350 is formed is shown, in accordance with an embodiment. In an embodiment, the second dielectric layer 350 may be laminated over the first dielectric layer 340. In an embodiment, conductive vias 313 and traces 314 may be formed in and over the second dielectric layer 350 with patterning processes typical in electronic packaging. It is to be appreciated that the magnetic body 325 is protected from the processing chemistries used to form the vias 313 and traces 314 by the first dielectric layer 340.

Figure 3F:
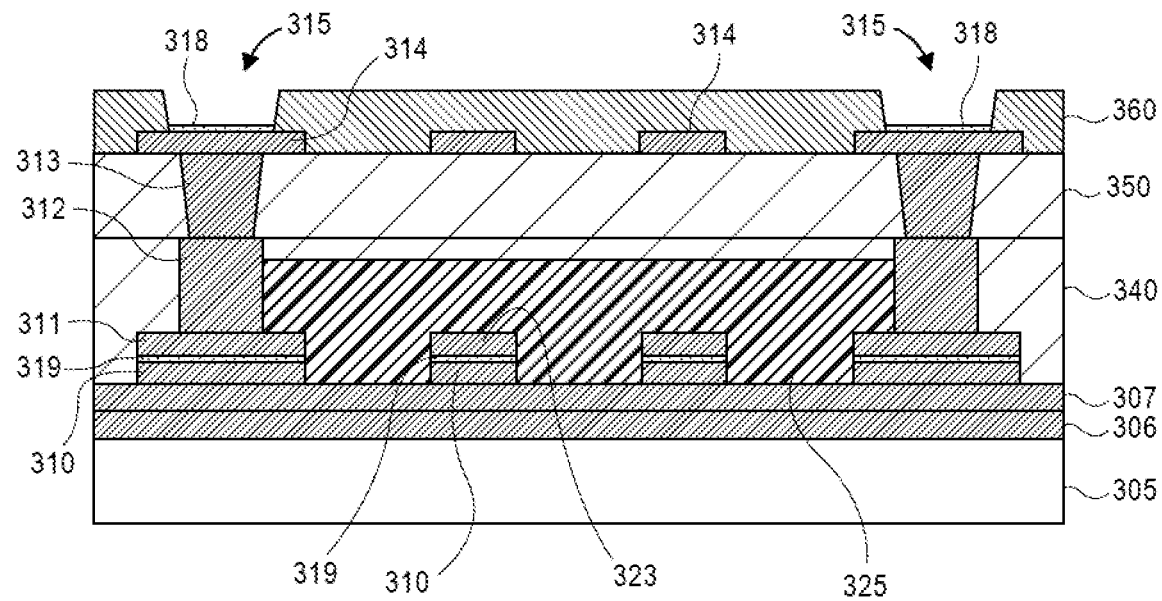
FIG. 3F is a cross-sectional illustration after a solder resist layer is disposed over the second dielectric layer, in accordance with an embodiment.

Referring now to FIG. 3F, a cross-sectional illustration after a solder resist layer 360 is formed and patterned is shown, in accordance with an embodiment. In an embodiment, the solder resist layer 360 may be formed over the second dielectric layer 350. Openings 315 may be formed through the solder resist layer 360. In an embodiment, a surface protection layer 318 may be formed over conductive traces 314 exposed by the openings 315.

Figure 3G:
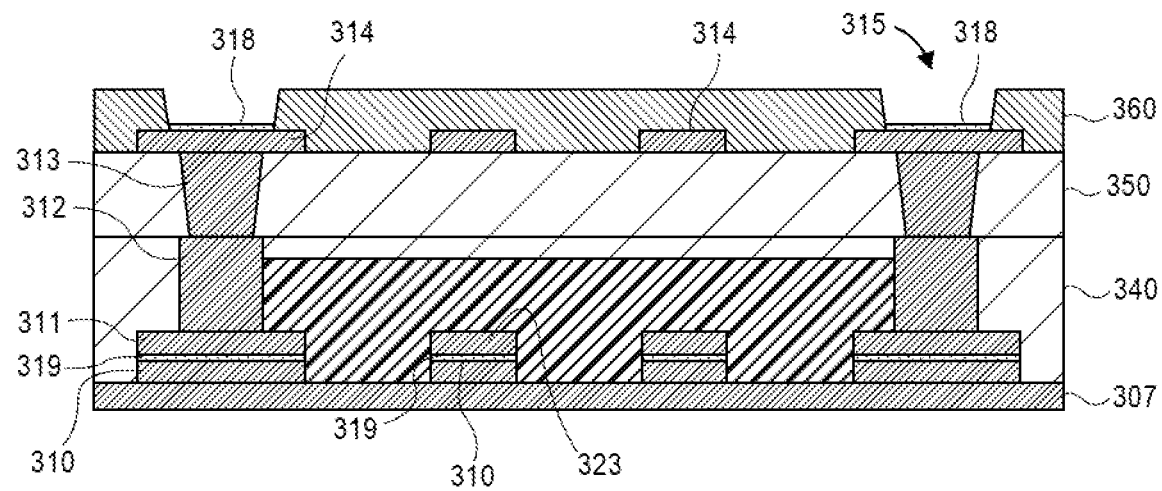
FIG. 3G is a cross-sectional illustration after the dummy core is removed, in accordance with an embodiment.

Referring now to FIG. 3G, a cross-sectional illustration after the dummy core is removed is shown, in accordance with an embodiment. In an embodiment, the removal of the dummy core 305 may leave behind film 307.

Figure 3H:
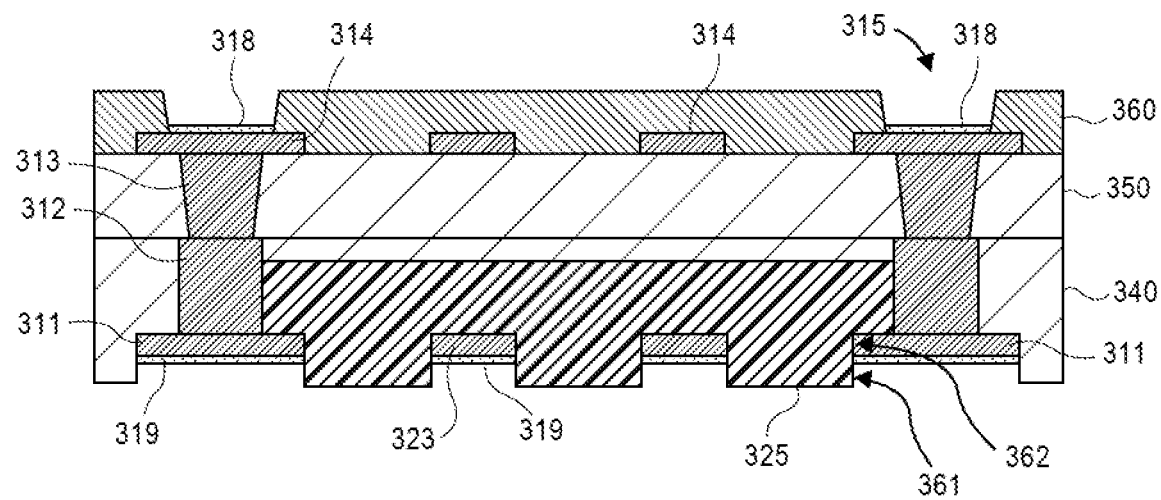
FIG. 3H is a cross-sectional illustration after sacrificial conductive features are removed, in accordance with an embodiment.

Referring now to FIG. 3H, a cross-sectional illustration after film 307 and the sacrificial layer 310 are removed is shown, in accordance with an embodiment. In an embodiment, the removal of the sacrificial portion may include exposing a portion of the magnetic body 325 to the wet etching chemistry. However, it is to be appreciated that only a relatively small portion of the magnetic body 325 is exposed. As such, the contamination of the bath may be minimal. If the contamination is too significant, a dedicated bath may be used for the removal of the sacrificial layer 310. As illustrated in FIG. 3H, the removal of the sacrificial layer 310 results in sidewall surfaces 361 of the magnetic body 325 being exposed. In an embodiment, the sidewall surface 361 may be substantially coplanar with a sidewall surface 362 of the first conductive layer 311.

Figure 3I:
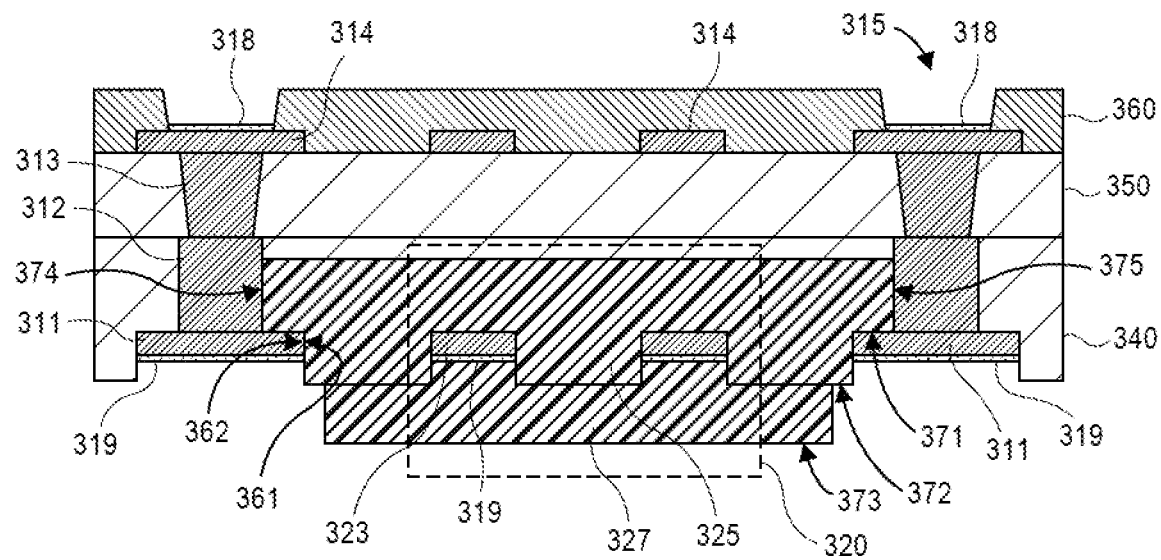
FIG. 3I is a cross-sectional illustration after a second portion of the magnetic body is disposed around the inductor traces, in accordance with an embodiment.

Referring now to FIG. 3I, a cross-sectional illustration after a second portion of the magnetic body 327 is disposed over bottom surfaces of the inductor traces 323 is shown, in accordance with an embodiment. In an embodiment, the second portion of the magnetic body 327 may be disposed with a printing process. In an embodiment, the second portion of the magnetic body 327 contacts the barrier layer 319 formed over the inductor traces 323. The addition of the second portion of the magnetic body 327 may result in a magnetic body (i.e., portions 325 and 327 combined) that forms a plurality of step surfaces. In an embodiment, a first step 371 may be formed in the first portion of the magnetic body 325. The first step may be in contact with the first conductive layer 311. In an embodiment, the second step 372 may be formed at the junction between the first magnetic portion 325 and the second magnetic portion 327. In the illustrated embodiment, the surface 373 of the second magnetic portion 327 is substantially planar. However, it is to be appreciated that the surface 373 may be non-planar due to the printing process. In an embodiment, the inductor 320 may include a transmission line inductor, a spiral inductor, or a solenoid inductor.

Referring now to FIGS. 4A-4I, a series of cross-sectional illustrations of a process for forming an electronic package with a passive device surrounded by magnetic material is shown, in accordance with an embodiment.

Figure 4A:
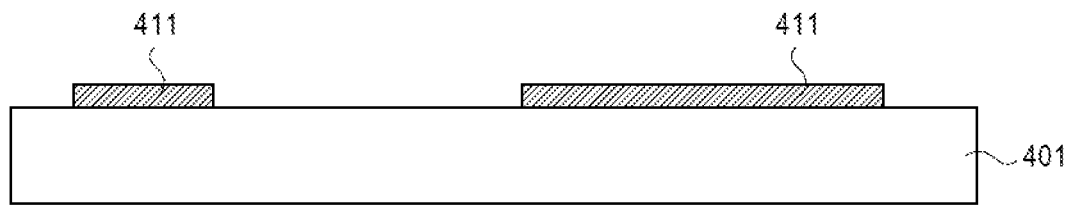
FIG. 4A is a cross-sectional illustration of first traces disposed over a package substrate, in accordance with an embodiment.

Referring now to FIG. 4A, a cross-sectional illustration of a substrate 401 with conductive traces 411 formed over the substrate 401 is shown, in accordance with an embodiment. In an embodiment, the substrate 401 may be a core of an electronic package. In an embodiment, the substrate 401 may be an underlying dielectric layer, such as a build-up layer. In an embodiment the conductive traces 411 may be formed with any suitable process. While only structures formed over a top surface of the substrate 401 are shown, it is to be appreciated that substantially similar structures may be formed on the opposing surface of the substrate 401 as is common in panel processing.

Figure 4B:
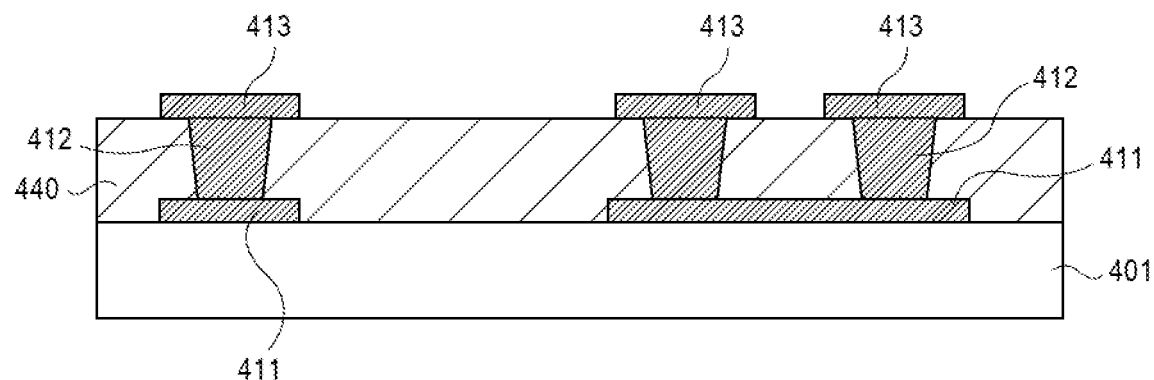
FIG. 4B is a cross-sectional illustration after a first dielectric layer is disposed over the substrate, in accordance with an embodiment.

Referring now to FIG. 4B, a cross-sectional illustration after a first dielectric layer 440 with conductive features 412 and 413 is formed is shown, in accordance with an embodiment. In an embodiment, the first dielectric layer may be laminated over the substrate 401. In an embodiment, the vias 412 and the conductive traces 413 may be formed with typical package processing operations such as a semi-additive process (SAP), or the like.

Figure 4C:
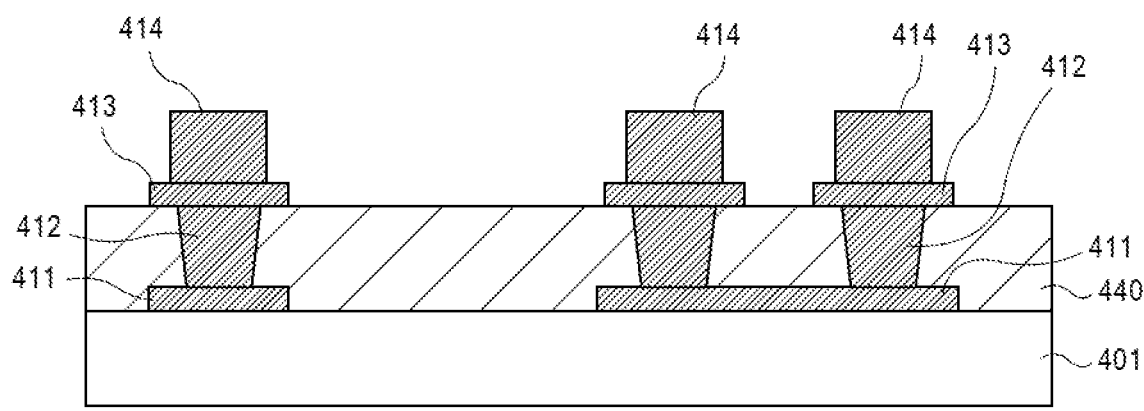
FIG. 4C is a cross-sectional illustration after pillars are disposed over the first dielectric layer, in accordance with an embodiment.

Referring now to FIG. 4C, a cross-sectional illustration after pillars 414 are formed is shown, in accordance with an embodiment. In an embodiment, the pillars 414 may be formed with a lithography process. Accordingly, the pillars 414 may be formed with substantially vertical sidewalls. It is to be appreciated that the pillars 412 may also include any feature that can confine a subsequently deposited magnetic body. For example, the pillars 412 may also refer to a wall, a block, a circular pad, or the like.

Figure 4D:
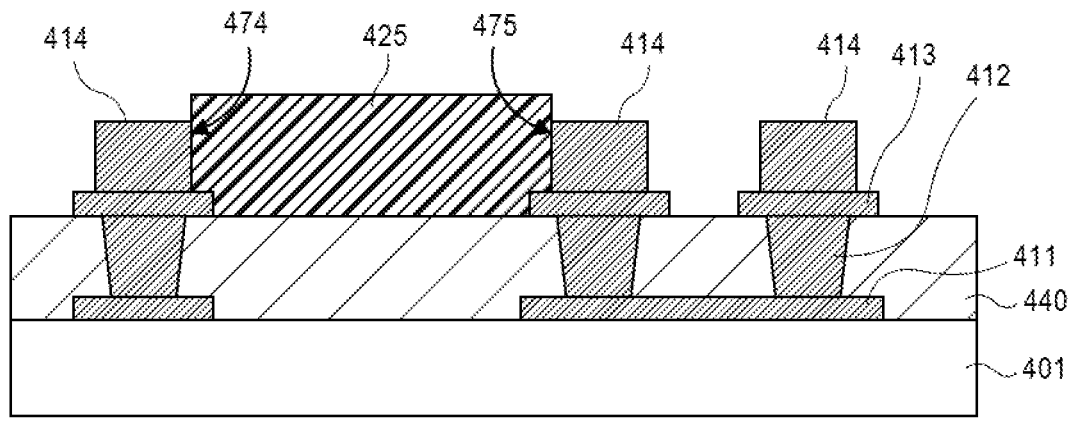
FIG. 4D is a cross-sectional illustration after a first magnetic body is disposed between pillars, in accordance with an embodiment.

Referring now to FIG. 4D, a cross-sectional illustration after a first magnetic body 425 is disposed over the first dielectric layer 440 is shown, in accordance with an embodiment. In an embodiment, the first magnetic body 425 may be disposed between pillars 425 with a printing process. As such, the first magnetic body 425 may include sidewalls 474 and 475 that contact the pillars 414 and are substantially vertical. Since the pillars 412 serve as boundaries, the printing process does not require a high degree of accuracy.

Figure 4E:
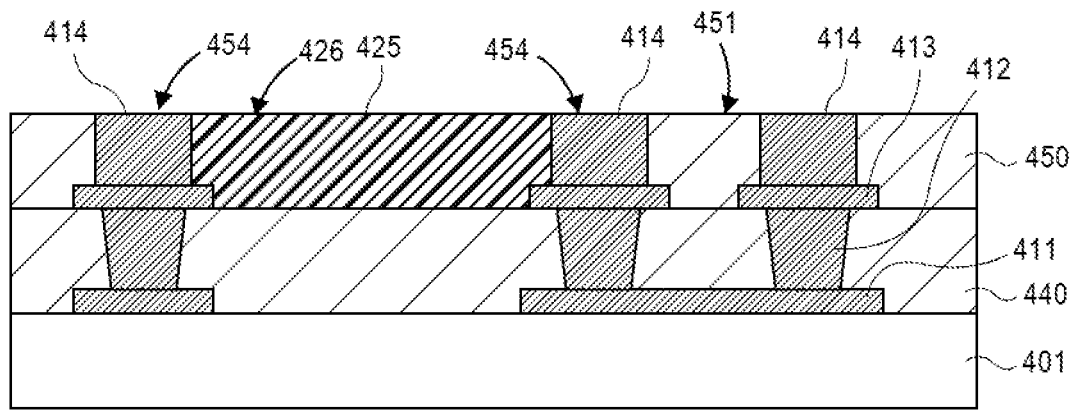
FIG. 4E is a cross-sectional illustration after a second dielectric layer is disposed and planarized with a surface of the first magnetic body, in accordance with an embodiment.

Referring now to FIG. 4E, a cross-sectional illustration after a second dielectric layer 450 is formed and planarized is shown, in accordance with an embodiment. In an embodiment, the second dielectric layer may be laminated and planarized with top surfaces of the pillars 412 and the first magnetic body 425. As such, surface 426 of the first magnetic body 425, surface 454 of the pillars 414 and surface 451 of the second dielectric layer 450 may all be substantially coplanar with each other.

Figure 4F:
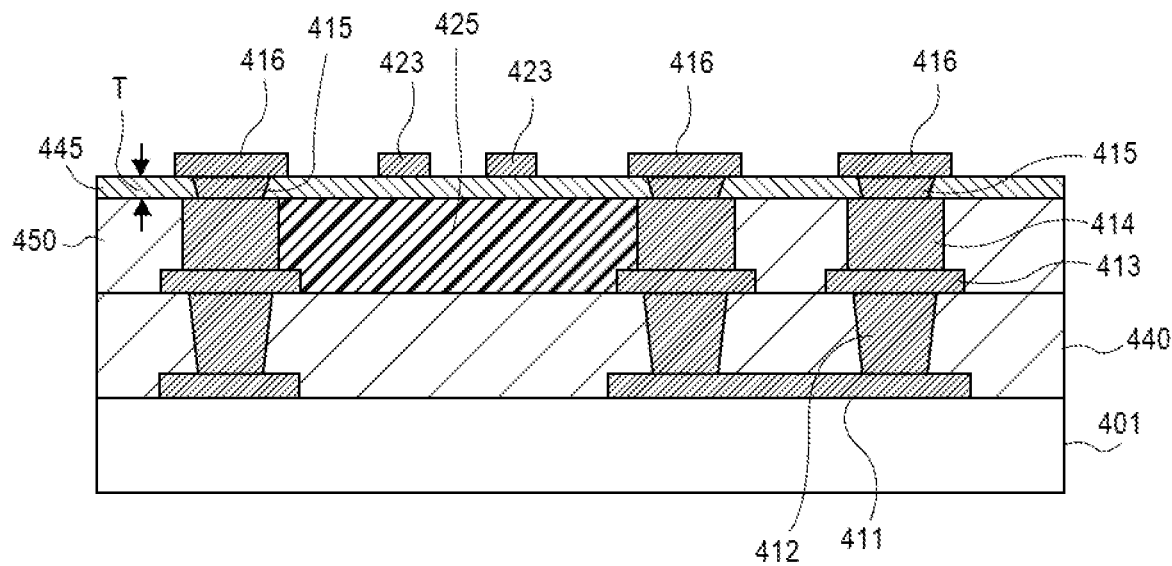
FIG. 4F is a cross-sectional illustration after a barrier layer is disposed over the first magnetic body and inductor traces are disposed over the barrier layer, in accordance with an embodiment.

Referring now to FIG. 4F, a cross-sectional illustration after a barrier layer 445 is formed and inductor traces 423 are formed over the barrier layer is shown, in accordance with an embodiment. In an embodiment, the barrier layer 445 may be laminated over the first magnetic body 425, the pillars 414 and the second dielectric layer 450. In order to improve the Q value of the subsequently formed inductor, the barrier layer 445 may be formed with a thickness T that is less than 10 μm. In an embodiment, the thickness T may be less than 5 μm. Embodiments may include a barrier layer 445 that is a dielectric layer that is laminated over underlying layers.

The barrier layer 445 protects the underlying first magnetic body 425 from wet chemistries that may be used to form layers above, such as the inductor traces 423 and other conductive traces 416. Additionally, vias 415 may be formed through the barrier layer 445 with processes such as laser drilling and plating. The desmear of laser drilled vias is also prevented from interacting with the first magnetic body 425 by the barrier layer 445.

Figure 4G:
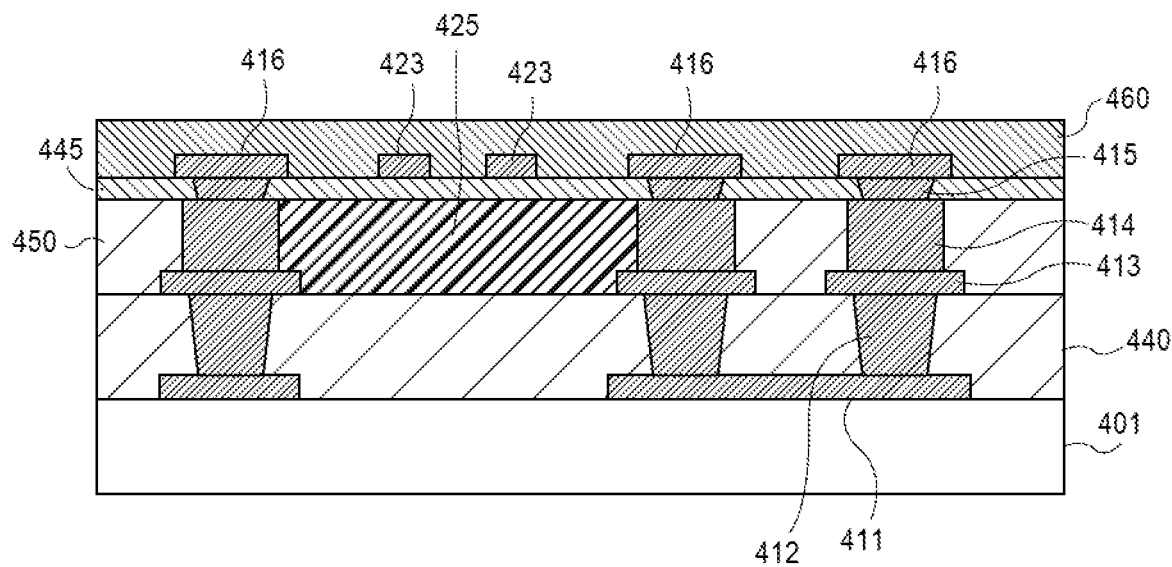
FIG. 4G is a cross-sectional illustration after a solder resist layer is disposed over the barrier layer, in accordance with an embodiment.

Referring now to FIG. 4G, a cross-sectional illustration after a solder resist layer 460 is formed over the barrier layer 445, the inductor traces 423, and the other traces 416 is shown, in accordance with an embodiment. The solder resist layer 460 may be laminated over the underlying layers, as is known in the art.

Figure 4H:
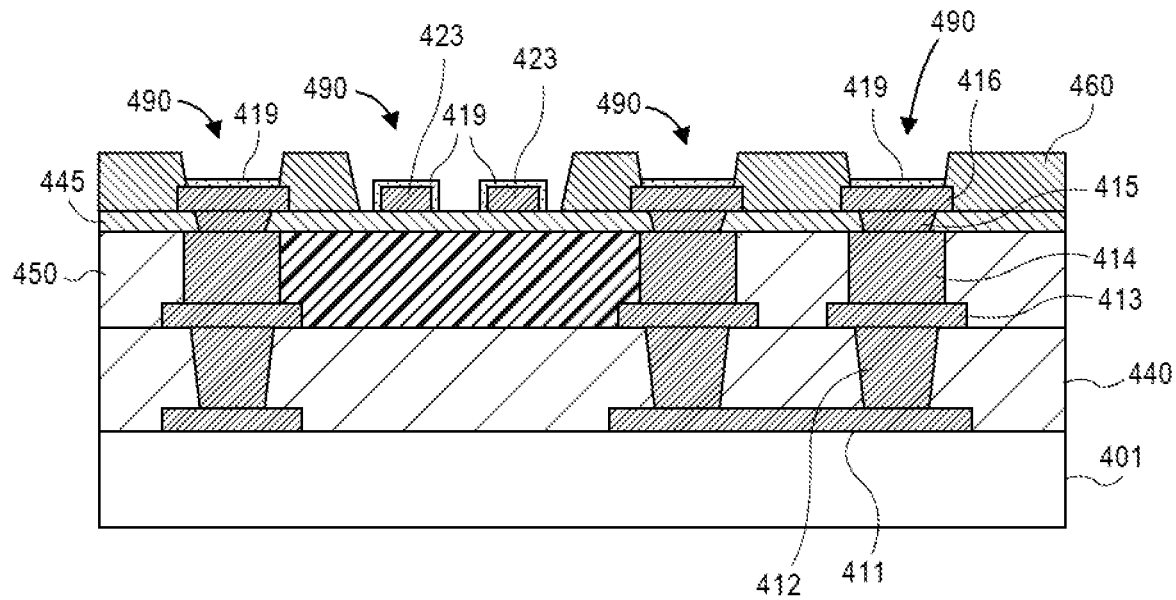
FIG. 4H is a cross-sectional illustration after openings are made in the solder resist layer, in accordance with an embodiment.
Figure 4I:
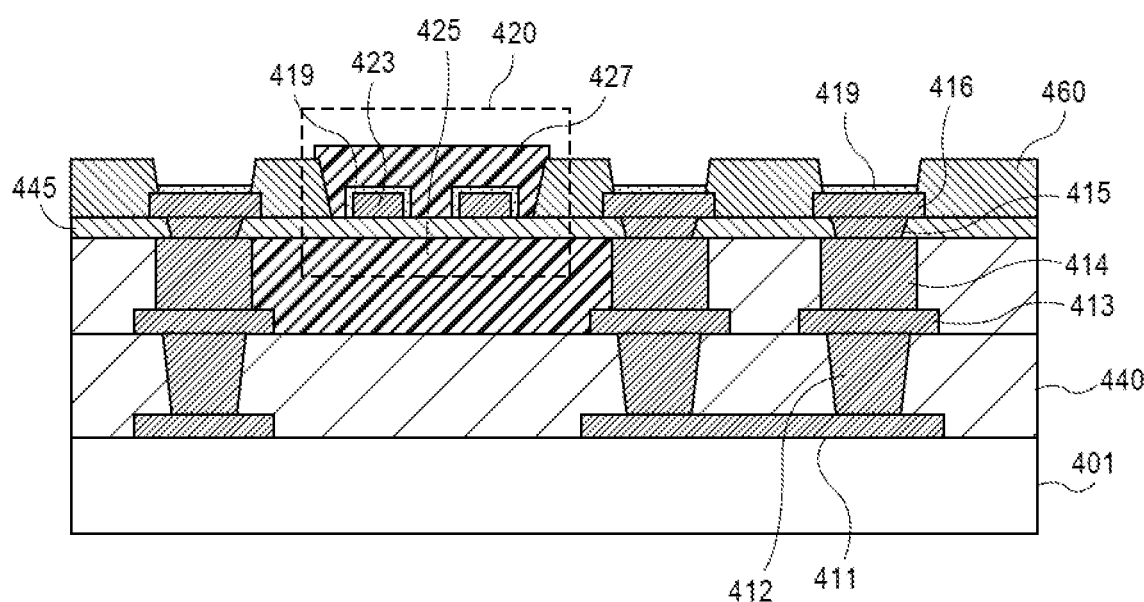
FIG. 4I is a cross-sectional illustration after a second magnetic body is disposed over the inductor traces, in accordance with an embodiment.

Referring now to FIG. 4H, a cross-sectional illustration after openings 490 are formed in the solder resist 460 is shown, in accordance with an embodiment. In an embodiment, an opening 490 may be formed over the inductor traces 423. In an embodiment, a surface protection layer 419 may be formed over the exposed traces 419 and the inductor traces 423. For example, the surface protection layer 419 may include metal barrier layers (e.g., NiPdAu) and/or OSP materials Referring now to FIG. 4I, a cross-sectional illustration after a second magnetic body 427 is disposed over the inductor traces 423 of the inductor 420 is shown, in accordance with an embodiment. In an embodiment, the second magnetic body 427 may be disposed in the opening 490 with a printing process. As such, the inductor traces 423 may be formed between portions of the first magnetic body 425 and the second magnetic body 425 with only a thin barrier layer 445 formed between them. Accordingly, the inductor 420 may have a high Q value without exposing any of the magnetic material to a wet chemistry. In an embodiment, the inductor 420 may include a transmission line inductor, a spiral inductor, or a solenoid inductor.

Figure 5:
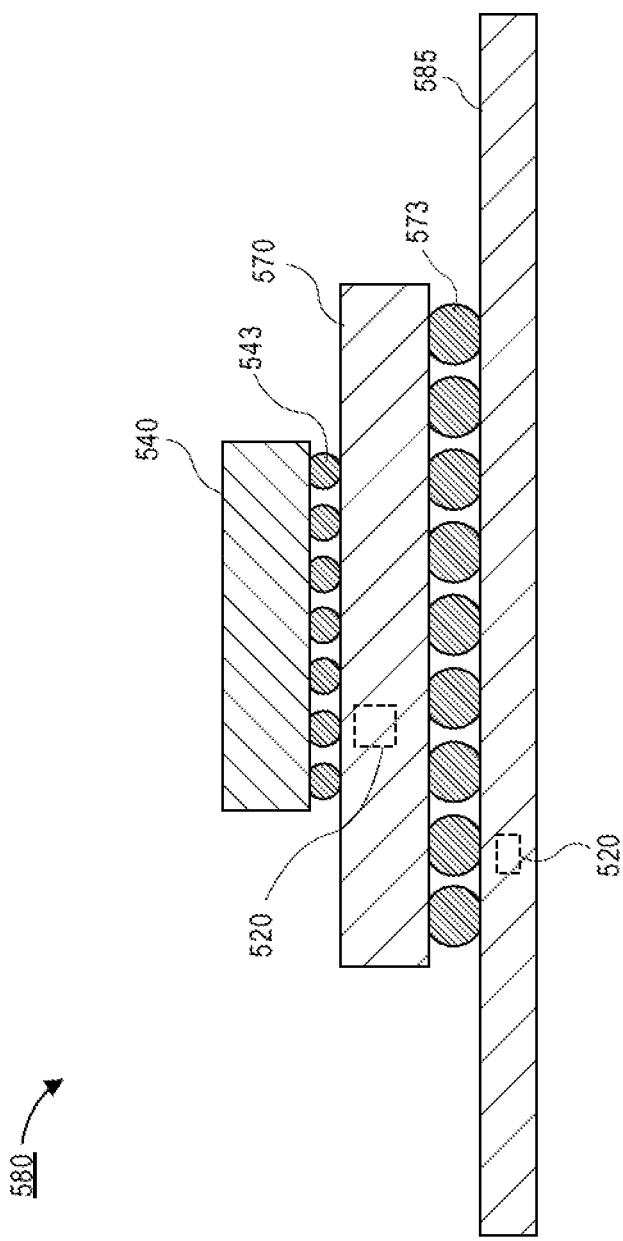
FIG. 5 is a cross-sectional illustration of an electronic package that includes an embedded magnetic material in the package substrate, in accordance with an embodiment.

Referring now to FIG. 5, a cross-sectional illustration of a packaged system 580 is shown, in accordance with an embodiment. In an embodiment, the packaged system 580 may include a die 540 electrically coupled to a package substrate 570 with solder bumps 543. In additional embodiments, the die 540 may be electrically coupled to the package substrate 570 with any suitable interconnect architecture, such as wire bonding or the like. The package substrate 570 may be electrically coupled to a board 585, such as a printed circuit board (PCB) with solder bumps 573 or any other suitable interconnect architecture, such as wire bonding or the like.

In an embodiment, an inductor 520 similar to embodiments described above may be integrated into the package substrate 570 or the board 585, or the package substrate 570 and the board 585. Embodiments include any number of inductors 520 formed into the package substrate 570 and the board 585. For example, a plurality of inductors 520 may be integrated into the circuitry of the package substrate 570 or the board 585, or the package substrate 570 and the board 585 for power management, filtering, or any other desired use.

Figure 6:
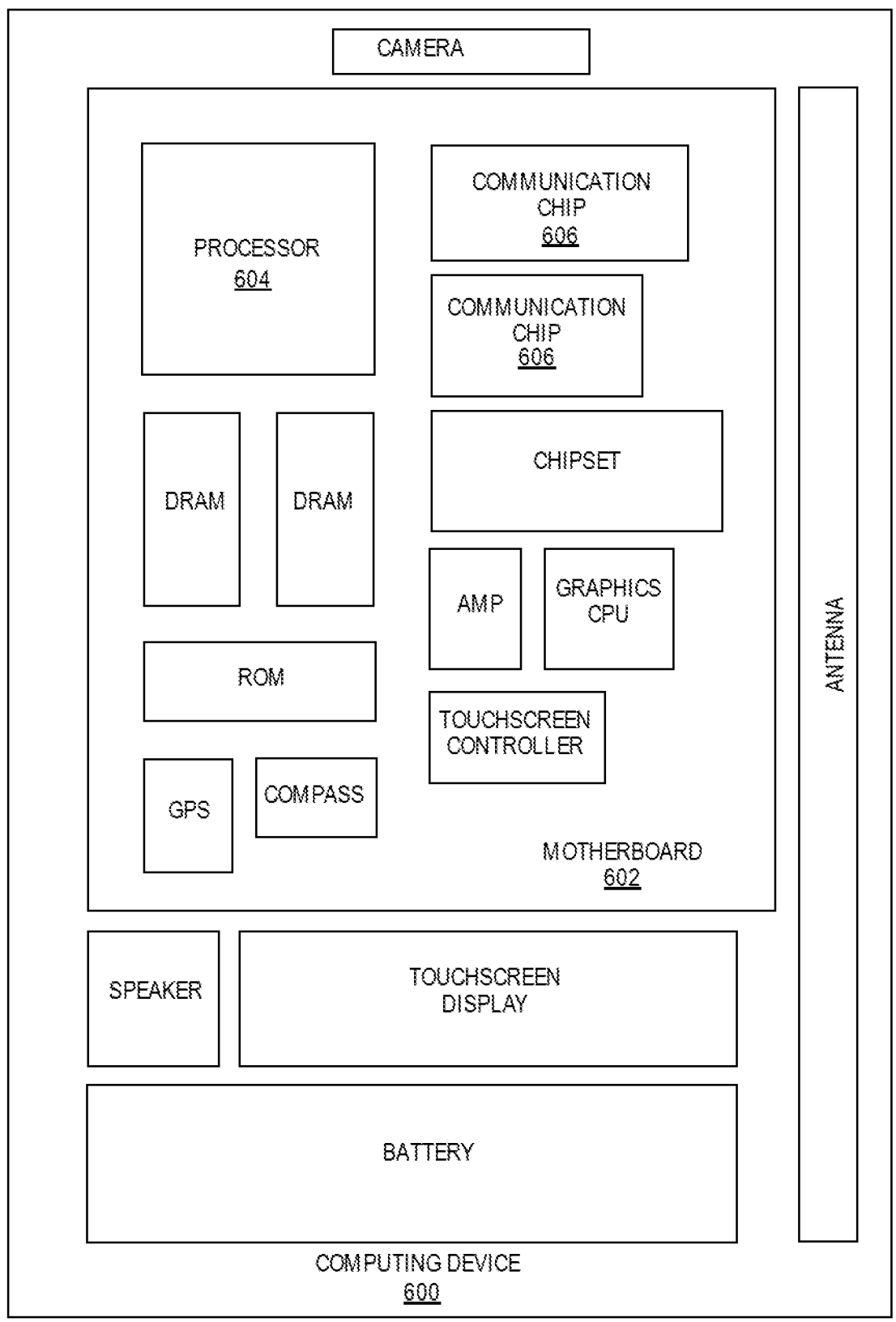
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be communicatively coupled to an organic electronic package that includes an inductor surrounded by magnetic material, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be communicatively coupled to an organic electronic package that includes an inductor surrounded by magnetic material, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 includes an inductor, comprising an inductor trace; and a magnetic body surrounding the inductor trace, wherein the magnetic body comprises a first step surface and a second step surface.

Example 2 includes the inductor of Example 1, wherein the inductor is integrated into a package substrate.

Example 3 includes the inductor of Example 1 or Example 2, further comprising: pillars embedded within the package substrate, wherein the magnetic body contacts surfaces of the pillars.

Example 4 includes that inductor of Example 1-3, further comprising: a first conductive layer contacting a surface of each of the pillars, wherein the first step surface is substantially coplanar with a surface of the first conductive layer.

Example 5 includes that inductor of Example 1-4, wherein the first conductive layer is substantially the same thickness as the inductor trace.

Example 6 includes that inductor of Example 1-5, wherein the pillars have substantially vertical sidewalls.

Example 7 includes that inductor of Example 1-6, wherein a surface of the inductor trace is substantially coplanar with first surfaces of the pillars.

Example 8 includes that inductor of Example 1-7, wherein the package substrate is a coreless package substrate.

Example 9 includes that inductor of Example 1-8, wherein the inductor is a transmission line inductor, a spiral inductor, or a solenoid inductor.

Example 10 includes an inductor comprising: a barrier layer; an inductor trace over a first surface of the barrier layer; a first magnetic body over the inductor trace and the first surface of the barrier layer; and a second magnetic body over a second surface of the barrier layer opposite the first surface, wherein a width of the second magnetic body is greater than a width of the first magnetic body.

Example 11 includes the inductor of Example 10, wherein sidewalls of the second magnetic body are substantially vertical.

Example 12 includes the inductor of Example 10 or Example 11, wherein sidewalls of the second magnetic body include a stepped surface.

Example 13 includes the inductor of Example 10-12, wherein sidewalls of the first magnetic body are tapered.

Example 14 includes the inductor of Example 10-13, wherein the barrier layer is less than approximately 5 μm.

Example 15 includes the inductor of Example 10-14, wherein the inductor is integrated into a package substrate.

Example 16 includes the inductor of Example 10-15, wherein pillars are formed into the package substrate, and wherein sidewalls of the second magnetic body contact the pillars.

Example 17 includes the inductor of Example 10-16, wherein the package substrate is a coreless substrate.

Example 18 includes the inductor of Example 10-17, wherein the package substrate includes a core.

Example 19 includes the inductor of Example 10-18, wherein the inductor is a transmission line inductor, a spiral inductor, or a solenoid inductor.

Example 20 includes an electronic package, comprising: a printed circuit board (PCB); a package substrate electrically coupled to the PCB; and an integrated circuit electrically coupled to the package substrate, wherein the an inductor is integrated into the PCB or the package substrate, wherein the inductor comprises: an inductor trace; and a magnetic body surrounding the inductor trace, wherein the magnetic body comprises a stepped surface.

Example 21 includes the electronic package of Example 20, further comprising pillars contacting sidewall surfaces of the magnetic body.

Example 22 includes the electronic package of Example 20 or Example 21, further comprising: a first conductive layer contacting a surface of each of the pillars, wherein a first step surface of the magnetic body is substantially coplanar with a surface of the first conductive layer.

Example 23 includes the electronic package of Example 20-22, further comprising: a barrier layer, wherein the inductor trace contacts a surface of the barrier layer.

Example 24 includes the electronic package of Example 20-23, further comprising a second magnetic body formed on a surface of the barrier layer opposing the inductor trace.

Example 25 includes the electronic package of Example 20-24, wherein a thickness of the barrier layer is approximately 5 μm or less.

What is claimed is:

1. An electronic package, comprising:
a printed circuit board (PCB);
a package substrate electrically coupled to the PCB; and
an integrated circuit electrically coupled to the package substrate; and
an inductor integrated into the PCB or the package substrate, wherein the inductor comprises:
an inductor trace; and
a magnetic body surrounding the inductor trace, wherein the magnetic body comprises a stepped surface, and wherein the magnetic body has a first width proximate to the integrated circuit and a second width distal from the integrated circuit, the first width greater than the second width.

2. The electronic package of claim 1, further comprising: pillars contacting sidewall surfaces of the magnetic body.

3. The electronic package of claim 2, further comprising: a first conductive layer contacting a surface of each of the pillars, wherein a first step surface of the magnetic body is substantially coplanar with a surface of the first conductive layer.

4. The electronic package of claim 1, further comprising: a barrier layer, wherein the inductor trace contacts a surface of the barrier layer.

5. The electronic package of claim 4, further comprising a second magnetic body formed on a surface of the barrier layer opposing the inductor trace.

6. The electronic package of claim 4, wherein a thickness of the barrier layer is approximately 5 μm or less.

7. An electronic package, comprising:
a printed circuit board (PCB); and
an inductor coupled to the PCB, the inductor, comprising:
an inductor trace; and
a magnetic body surrounding the inductor trace, wherein the magnetic body comprises a first step surface and a second step surface, the first step surface and the second step surface on a same lateral side of the magnetic body, and wherein the magnetic body has a first width proximate to the PCB and a second width distal from the PCB, the second width greater than the first width.

8. The electronic package of claim 7, wherein the inductor is integrated into a package substrate.

9. The electronic package of claim 8, further comprising: pillars embedded within the package substrate, wherein the magnetic body contacts surfaces of the pillars.

10. The electronic package of claim 9, further comprising: a first conductive layer contacting a surface of each of the pillars, wherein the first step surface is substantially coplanar with a surface of the first conductive layer.

11. The electronic package of claim 10, wherein the first conductive layer is substantially the same thickness as the inductor trace.

12. The electronic package of claim 9, wherein the pillars have substantially vertical sidewalls.

13. The electronic package of claim 9, wherein a surface of the inductor trace is substantially coplanar with first surfaces of the pillars.

14. The electronic package of claim 8, wherein the package substrate is a coreless package substrate.

15. The electronic package of claim 7, wherein the inductor is a transmission line inductor, a spiral inductor, or a solenoid inductor.

16. An electronic package, comprising:
a printed circuit board (PCB); and
an inductor coupled to the PCB, the inductor, comprising:
a barrier layer;
an inductor trace over a first surface of the barrier layer;
a first magnetic body over the inductor trace and the first surface of the barrier layer; and
a second magnetic body over a second surface of the barrier layer opposite the first surface, wherein a width of the second magnetic body is greater than a width of the first magnetic body, and wherein the second magnetic body is not in contact with first magnetic body.

17. The electronic package of claim 16, wherein sidewalls of the second magnetic body are substantially vertical.

18. The electronic package of claim 17, wherein sidewalls of the second magnetic body include a stepped surface.

19. The electronic package of claim 17, wherein sidewalls of the first magnetic body are tapered.

20. The electronic package of claim 16, wherein the barrier layer is less than approximately 5 μm.

21. The electronic package of claim 16, wherein the inductor is integrated into a package substrate.

22. The electronic package of claim 21, wherein pillars are formed into the package substrate, and wherein sidewalls of the second magnetic body contact the pillars.

23. The electronic package of claim 21, wherein the package substrate is a coreless substrate.

24. The electronic package of claim 21, wherein the package substrate includes a core.

25. The electronic package of claim 16, wherein the inductor is a transmission line inductor, a spiral inductor, or a solenoid inductor.

* * * * *